(12) United States Patent
Tung (10) Patent No.: US 11,702,273 B2
(45) Date of Patent: Jul. 18, 2023

(54) STORAGE CONTAINER AND SUPPLY SYSTEM

(71) Applicant: CHANGXIN MEMORY TECHNOLOGIES, INC., Hefei (CN)

(72) Inventor: Chia Jen Tung, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 131 days.

(21) Appl. No.: 17/444,182

(22) Filed: Jul. 30, 2021

(65) Prior Publication Data
US 2021/0354904 A1 Nov. 18, 2021

Related U.S. Application Data

(63) Continuation of application No. PCT/CN2021/079809, filed on Mar. 9, 2021.

(30) Foreign Application Priority Data

Mar. 25, 2020 (CN) .......................... 202010218909.X (51) Int. Cl.
*B65D 83/00* (2006.01)
*B67D 3/00* (2006.01)

(52) U.S. Cl.
CPC ....... *B65D 83/0005* (2013.01); *B67D 3/0003* (2013.01)

(58) Field of Classification Search
CPC ............................ B67D 3/0003; B67D 7/0227; B65D 83/0005; B65D 47/06; G03F 7/30; G03F 7/16; B05C 5/02; B05C 11/10
(Continued)

(56) References Cited

U.S. PATENT DOCUMENTS 2,349,726 A * 5/1944 Holler ................ B65D 83/0011
222/390
5,462,207 A * 10/1995 Daraktchiev ............. B08B 9/08
141/91
(Continued)

FOREIGN PATENT DOCUMENTS

CN 2080054 U 7/1991
CN 101737314 A 6/2010
(Continued)

OTHER PUBLICATIONS

CN 1st Office Action in Application No. 202010218909.X, dated Mar. 18, 2022.
(Continued)

*Primary Examiner* — Lien M Ngo
(74) *Attorney, Agent, or Firm* — Syncoda LLC; Feng Ma (57) ABSTRACT

A storage container includes: a sidewall portion, a seal portion and a movable member. The sidewall portion, the seal portion and the movable member define an accommodation space. The seal portion is adapted to seal a top of the sidewall portion, and the seal portion is provided with a hole communicated with the accommodation space. The movable member is adapted to seal a bottom of the sidewall portion, and further adapted to move up and down in parallel to a direction of the bottom of the sidewall portion pointing to the top. The movable member is configured to connect a control device. The control device controls the movable member to move up and down in a direction of the bottom of the sidewall portion pointing to the top.

16 Claims, 7 Drawing Sheets

(58) Field of Classification Search
USPC .................. 222/52, 386, 386.5, 390
See application file for complete search history.

(56) References Cited

U.S. PATENT DOCUMENTS

| | | | | |
|---|---|---|---|---|
| 5,819,980 | A * | 10/1998 | Hill .................... | B65D 83/0011 222/386.5 |
| 8,292,598 | B2 * | 10/2012 | Laverdiere ............ | F04B 49/065 417/413.1 |
| 2015/0261089 | A1 * | 9/2015 | Zhou ........................ | G03F 7/16 222/190 |

FOREIGN PATENT DOCUMENTS

| | | |
|---|---|---|
| CN | 101758003 A | 6/2010 |
| CN | 202575025 U | 12/2012 |
| CN | 103511221 A | 1/2014 |
| CN | 204178123 U | 2/2015 |
| CN | 104622383 A | 5/2015 |
| CN | 204583618 U | 8/2015 |
| CN | 104916565 A | 9/2015 |
| CN | 204602555 U | 9/2015 |
| CN | 105499080 A | 4/2016 |
| CN | 106074178 A | 11/2016 |
| CN | 106104267 A | 11/2016 |
| CN | 206064742 U | 4/2017 |
| CN | 106941074 A | 7/2017 |
| CN | 206587993 U | 10/2017 |
| CN | 207191927 U | 4/2018 |
| CN | 107983011 A | 5/2018 |
| CN | 108465604 A | 8/2018 |
| CN | 208098509 U | 11/2018 |
| CN | 208842987 U | 5/2019 |
| CN | 209080644 U | 7/2019 |
| CN | 209127332 U | 7/2019 |
| CN | 110888302 A | 3/2020 |
| CN | 210647111 U | 6/2020 |
| KR | 20120133226 A | 12/2012 |
| KR | 20120133227 A | 12/2012 |
| TW | 235284 B | 7/2005 |
| WO | WO 2004/063997 A2 * | 7/2004 |

OTHER PUBLICATIONS

International Search Report in Application No. PCT/CN2021/079809, dated May 27, 2021.
Second Office Action of the Chinese application No. 202010218909.X, dated Aug. 3, 2022.
Third Office Action of the Chinese application No. 202010218909.X, dated Oct. 14, 2022.
English translation of the Written Opinion of the International Search Authority in the international application No. PCT/DN2021/079809, dated May 27, 2021.

* cited by examiner

STORAGE CONTAINER AND SUPPLY SYSTEM

CROSS-REFERENCE TO RELATED APPLICATIONS

This application is a continuation of International Patent Application No.: PCT/CN2021/079809 filed on Mar. 9, 2021, which claims priority to Chinese Patent Application No. 202010218909.X filed on Mar. 25, 2020. The disclosures of these applications are hereby incorporated by reference in their entirety.

BACKGROUND

A photoresist is a key material for fine patterning in microelectronics technologies; in particular, the development of large-scale and very-large-scale integrated circuits has greatly promoted the research, development and application of the photoresist in recent years. Currently, in the semiconductor process technologies, the photoresist is pressed out from a storage container by gas for use.

SUMMARY

The present disclosure relates generally to the field of semiconductor process technologies, and more specifically to a storage container and a supply system.

Embodiments of the present disclosure provide a storage container and a supply system to avoid contact between a photoresist and air, thereby preventing the dissolution of gas in the photoresist.

In order to solve the above technical problem, the embodiments of the present disclosure provide a storage container for accommodating and removing a photoresist, including: a sidewall portion, a seal portion and a movable member, the sidewall portion, the seal portion and the movable member defining an accommodation space; the seal portion being adapted to seal a top of the sidewall portion, and the seal portion being provided with a hole communicated with the accommodation space, the hole being configured to connect a liquid inlet end of a liquid outlet conduit; the movable member being adapted to seal a bottom of the sidewall portion, and further adapted to move up and down in parallel to a direction of the bottom of the sidewall portion pointing to the top. The movable member is configured to connect a control device, and the control device controls the movable member to move up and down in the direction of the bottom of the sidewall portion pointing to the top, so as to discharge the photoresist in the accommodation space through the hole.

The embodiments of the present disclosure further provide a supply system, including: a control device, a liquid outlet conduit and the storage container described above; the liquid inlet end of the liquid outlet conduit being connected to the hole on the seal portion in the storage container; the control device being connected to the movable member in the storage container and configured to control the movable member to move up and down in the direction of the bottom of the sidewall portion in the storage container pointing to the top, so as to enable the photoresist accommodated in the storage container to enter the liquid outlet conduit through the hole; and the liquid inlet end of the liquid outlet conduit being configured to apply the photoresist removed from the storage container.

DETAILED DESCRIPTION

In a process of pressing the photoresist out from the storage container by gas, the gas may dissolve in the photoresist, so that bubbles are generated in the photoresist, and these bubbles may lead to an anomaly in the photoresist in a coating process.

In order to solve the above problem, some embodiments of the present disclosure provide a storage container for accommodating and removing a photoresist, in which the movable member moves up and down in parallel to the direction of the bottom of the sidewall portion pointing to the top, so that the accommodation space defined by the sidewall portion, the seal portion and the movable member becomes smaller, so as to enable the photoresist to be pressed out from the hole in the seal portion to avoid the contact between the photoresist and the air, thereby avoiding the dissolution of gas in the photoresist and solving the problem in the related art that bubbles dissolving in the photoresist may lead to an anomaly in the photoresist in a coating process.

To enable the objectives, technical solutions and advantages of the present disclosure to be clearer, various embodiments of the present disclosure are elaborated in detail below with reference to the accompanying drawings. However, it would be appreciated by those of ordinary skill in the art that a number of technical details are provided in the embodiments of the present disclosure to help a reader understand the present disclosure better. However, technical solutions sought to be protected by the present disclosure can also be implemented without these technical details and various changes and modifications based on the following embodiments. The embodiments below are divided for the convenience of description, and should not constitute any limitation on specific implementation manners of the present disclosure. The embodiments may be combined with each other and mutually referred to without contradiction.

Figure 1:
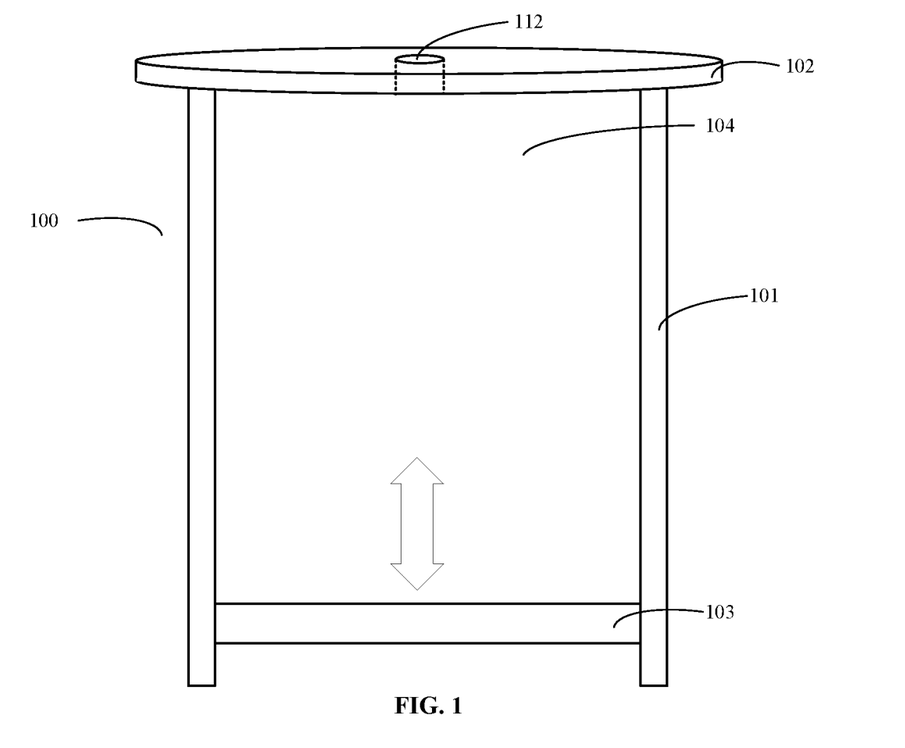
FIG. 1 is a schematic structural diagram of a storage container according to some embodiments of the present disclosure.
Figure 2:
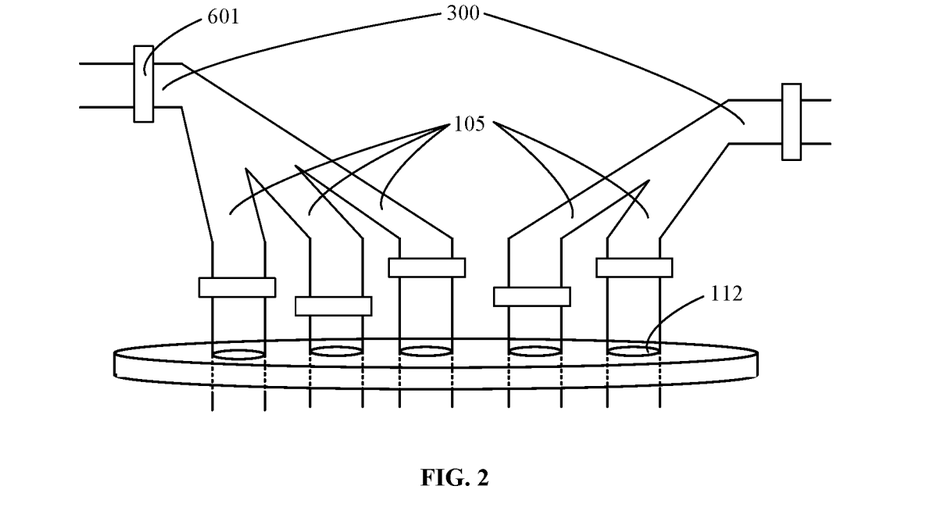
FIG. 2 is a schematic diagram of layout and connections of holes in a seal portion according to some embodiments of the present disclosure.
Figure 3:
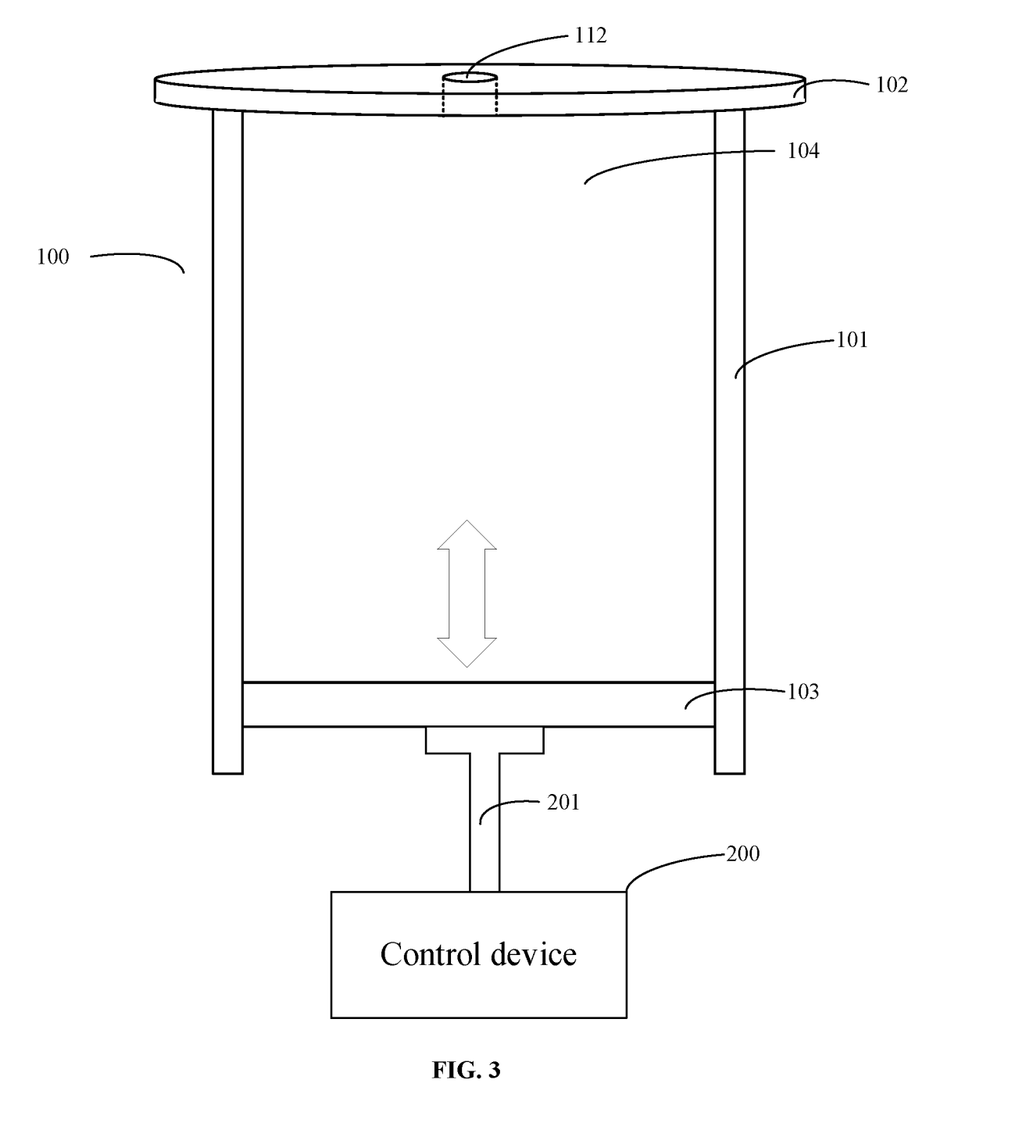
FIG. 3 is a schematic diagram of implementation of a control device pushing a movable member through a push portion according to some embodiments of the present disclosure.
Figure 4:
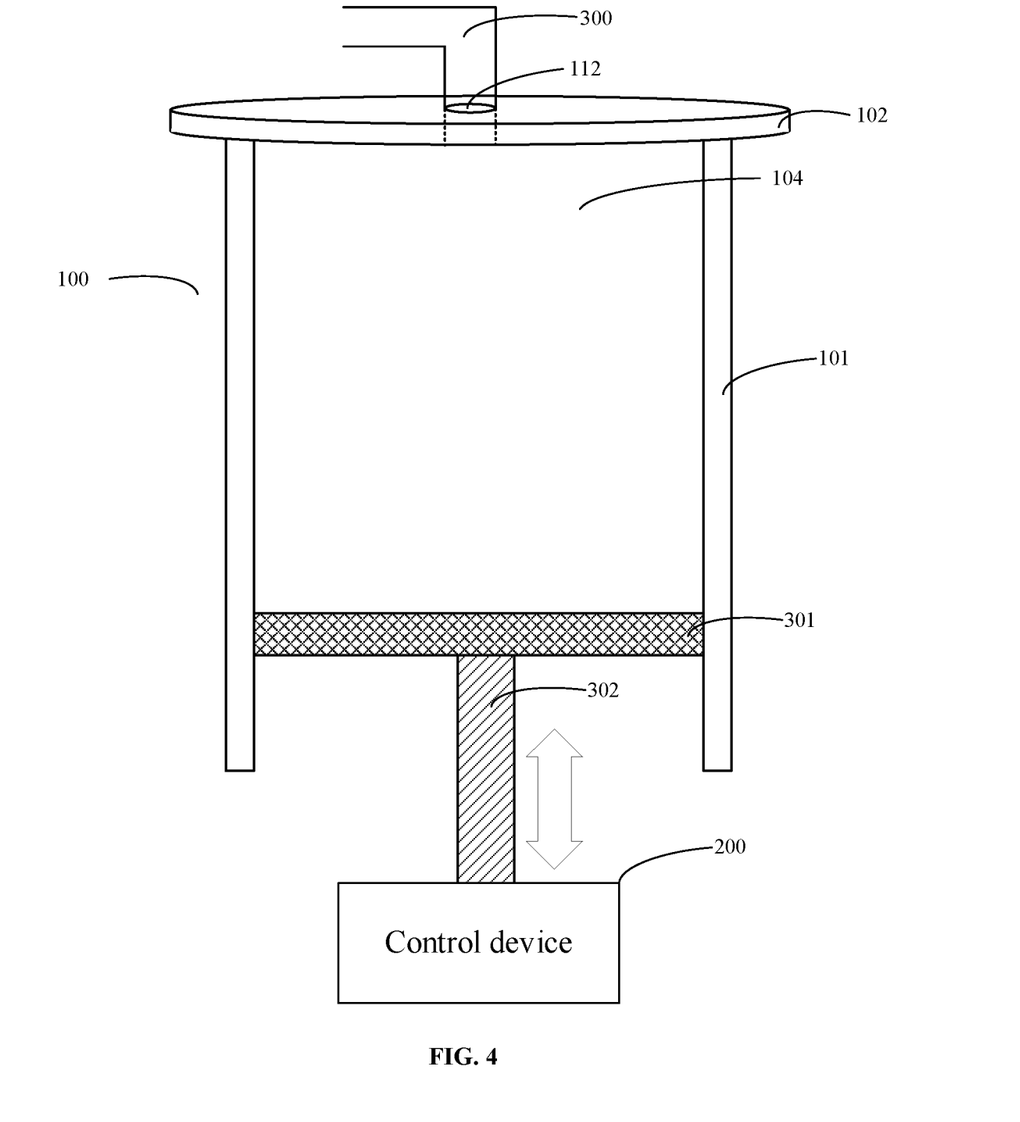
FIG. 4 is a first schematic structural diagram of the movable member according to some embodiments of the present disclosure.
Figure 5:
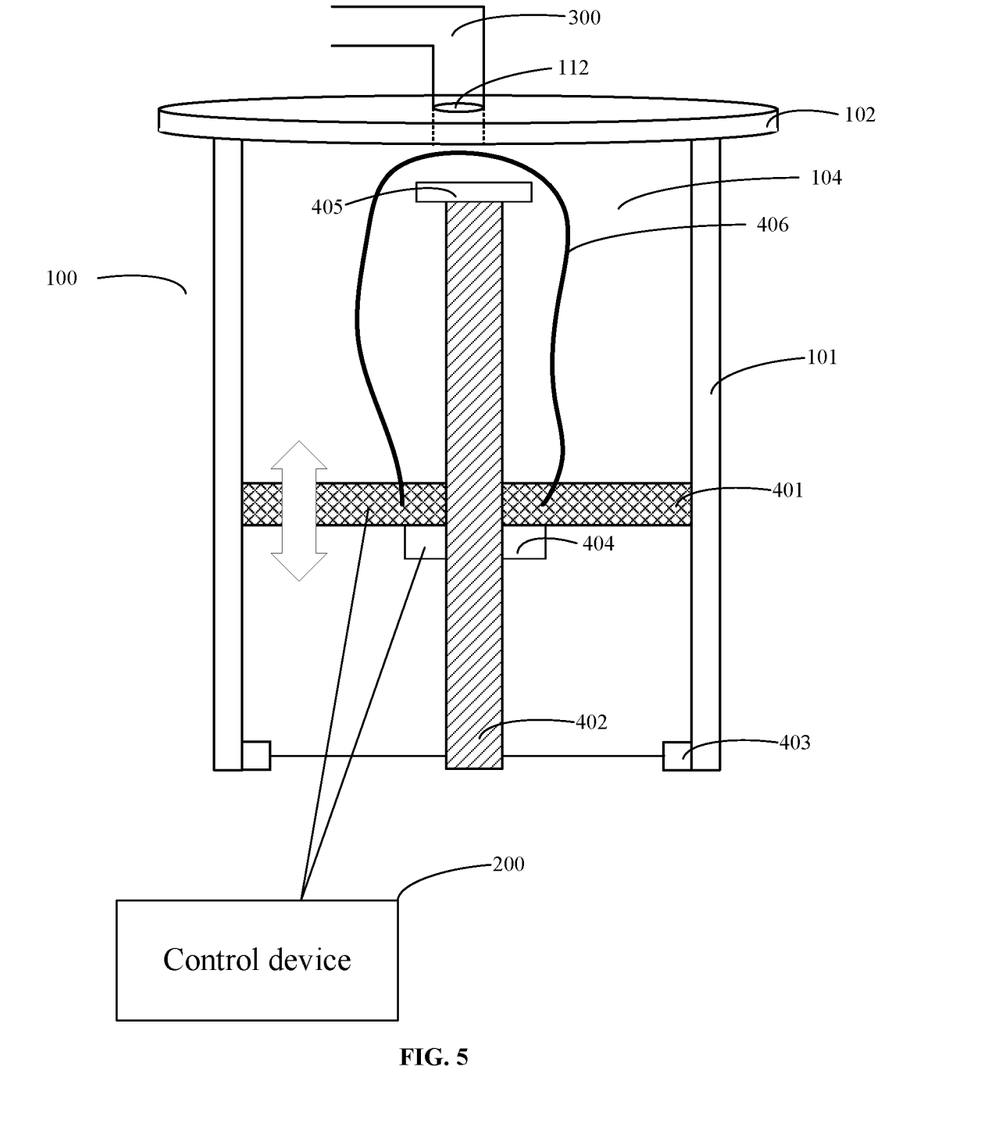
FIG. 5 is a second schematic structural diagram of the movable member according to some embodiments of the present disclosure.
Figure 6:
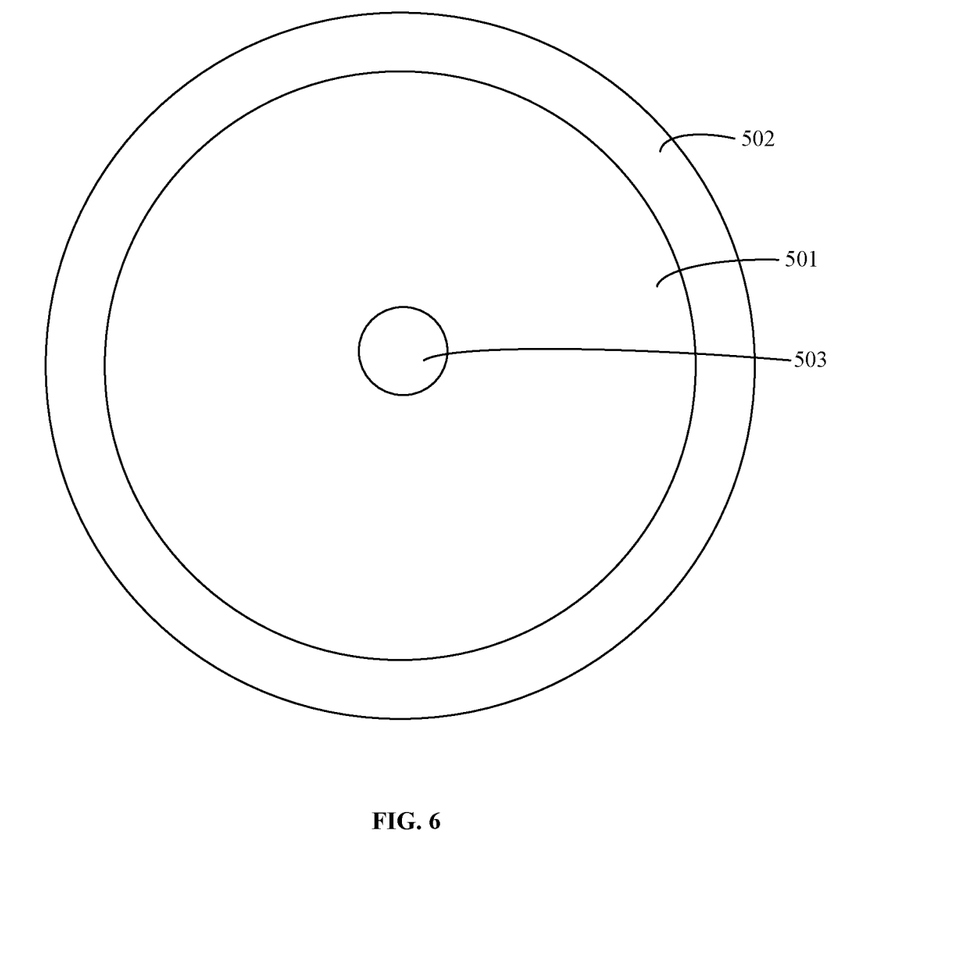
FIG. 6 is a schematic structural diagram of a sealing portion according to some embodiments of the present disclosure.
Figure 7:
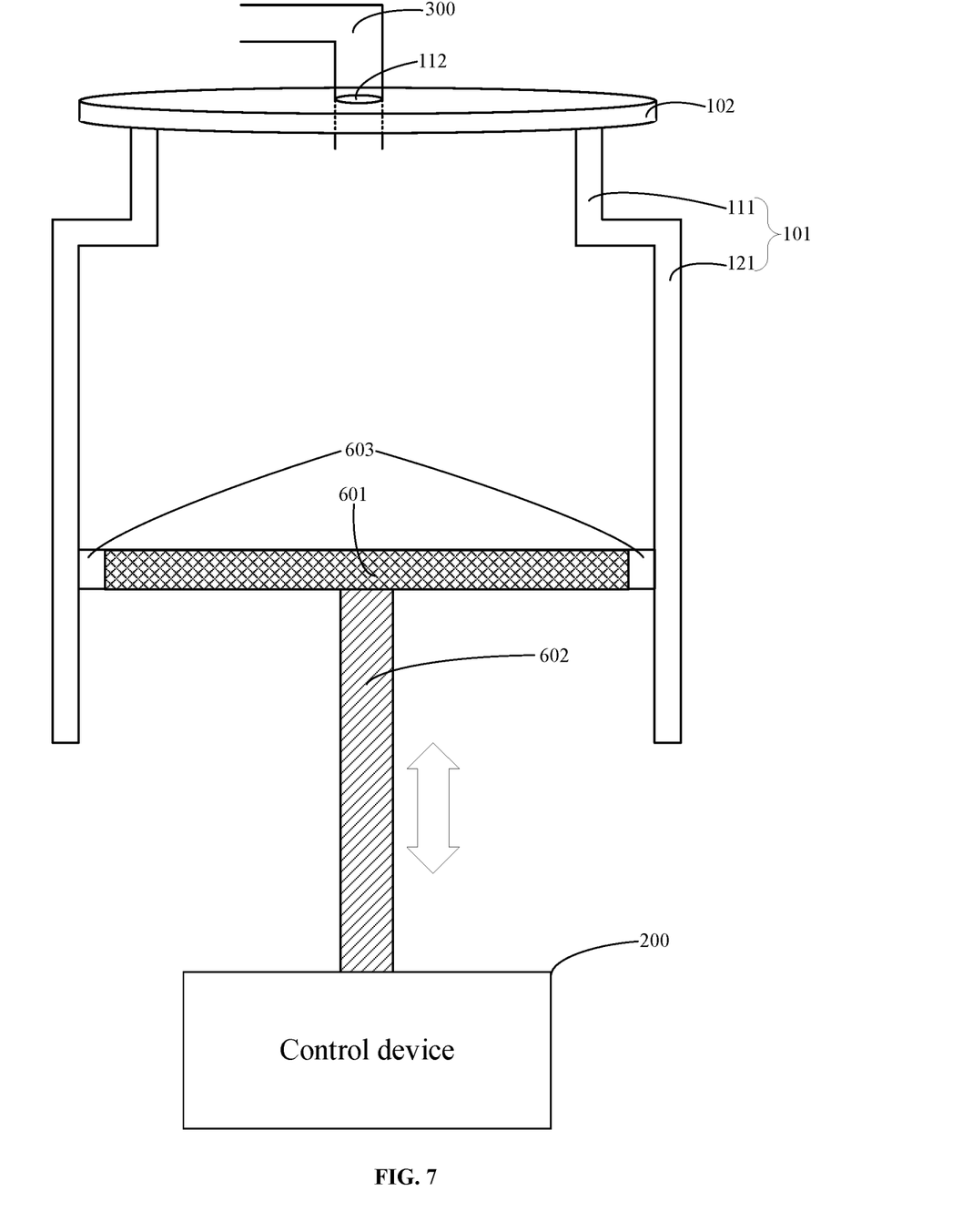
FIG. 7 is a specific schematic structural diagram of the storage container according to some embodiments of the present disclosure.

FIG. 1 is a schematic structural diagram of a storage container according to this embodiment, FIG. 2 is a schematic diagram of layout and connections of holes in a seal portion according to this embodiment, FIG. 3 is a schematic diagram of implementation of a control device pushing a movable member through a push portion according to this embodiment, FIG. 4 and FIG. 5 are specific schematic structural diagrams of the movable member according to this embodiment, FIG. 6 is a schematic structural diagram of a sealing portion according to this embodiment, and FIG. 7 is a specific schematic structural diagram of the storage container according to this embodiment. The storage container 100 according to this embodiment is specifically described below with reference to the accompanying drawings.

Referring to FIG. 1, the storage container 100 for accommodating and removing a photoresist includes: a sidewall portion 101, a seal portion 102 and a movable member 103. The sidewall portion 101, the seal portion 102 and the movable member 103 define an accommodation space 104. The accommodation space 104 is configured to accommodate the photoresist. The seal portion 102 is adapted to seal a top of the sidewall portion 101, and the seal portion 102 is provided with a hole 112 communicated with the accommodation space 104. The hole 112 is configured to connect a liquid inlet end of a liquid outlet conduit (not shown). The movable member 103 is adapted to seal a bottom of the sidewall portion 101, and further adapted to move up and down in parallel to a direction of the bottom of the sidewall portion 101 pointing to the top. The movable member 103 is configured to connect a control device (not shown). The control device (not shown) controls the movable member 103 to move up and down in the direction of the bottom of the sidewall portion 101 pointing to the top, so as to discharge the photoresist in the accommodation space 104 through the hole 112.

In terms of the sidewall portion 101, this embodiment is illustrated with an example in which the sidewall portion 101 is columnar, and this does not constitute any limitation on the solution. In other embodiments, the sidewall portion may be square. In a specific application, it would be appreciated by those skilled in the art that the shape of the sidewall portion may be set as needed.

Specifically, referring to FIG. 7, the sidewall portion 101 is columnar, and the sidewall portion 101 has a thickness ranging from 1 mm to 2.5 mm, for example, 1.3 mm, 1.7 mm, 2.0 mm or 2.3 mm. It should be noted that in this embodiment, the sidewall portion 101 may be made of glass. The sidewall portion 101 includes a bottleneck portion 111 and a bottle body portion 121. The bottleneck portion 111 has a height of 8 cm, and the bottle body portion 121 has a height of 24 cm. The bottle body portion 121 has an inner surface diameter of 15 cm, and the bottleneck portion 111 has an inner surface diameter of 3 cm.

In terms of the seal portion 102, referring to FIG. 2, the seal portion 102 is provided with N holes 112, where N is a natural number greater than or equal to 2. This embodiment is illustrated with 5 (N=5) holes 112 as an example, which does not constitute any limitation on the solution. During specific use, a number of the holes 112 may be set according to a size of the storage container 100 or specific use of the storage container 100.

Specifically, referring to FIG. 7, the seal portion 102 has a diameter of 4 cm and the hole 112 has a diameter of 1 cm.

Still referring to FIG. 2, each of the N holes 112 is connected to a liquid inlet end of a sub-conduit 105, and the liquid inlet ends of the N sub-conduits 105 are configured to connect the liquid outlet conduit 300. The photoresist in the accommodation space 104 is discharged through a plurality of holes 112, so as to avoid the problem of excessive pressure possibly caused by a single hole 112.

Specifically, the liquid inlet ends of the N sub-conduits 105 are configured to connect liquid inlet ends of M liquid outlet conduits 300, where M is a natural number greater than or equal to 2 and M is less than N. This embodiment is illustrated with 2 (M=2) liquid outlet conduits 300 as an example, which does not constitute any limitation on the solution. During specific use, a number of the liquid outlet conduits 300 may be set according to a size of the storage container 100 or specific use of the storage container 100.

Each of the M liquid outlet conduits 300 is connected to at least one of the N sub-conduits 105. This embodiment is illustrated with 5 sub-conduits 105 connected to 2 liquid outlet conduits 300 as an example. A plurality of liquid outlet conduits 300 are arranged, so that one storage container 100 can supply the photoresist to the plurality of liquid outlet conduits 300, and the photoresist in the storage container 100 can be simultaneously supplied to different semiconductor processes.

In addition, the storage container 100 further includes a valve 601. The valve 601 is mounted in at least one of the subconduit 105 and the liquid outlet conduit 300. In this embodiment, the valve 601 is mounted in the subconduit 105 and the liquid outlet conduit 300. With the valve 601, a number of used sub-conduits 105 connected to one liquid outlet conduit 300 and a number of liquid outlet conduits 300 used can be controlled, and when the movable member 103 does not operate, the valve 601 can be switched off to avoid the contact between the photoresist and the air.

Still referring to FIG. 1, for the movable member 103, as the movable member 103 moves up and down, a volume of the accommodation space 104 also becomes larger or smaller accordingly. When the accommodation space 104 becomes smaller, the photoresist accommodated in the accommodation space 104 is discharged through the hole 112 in the seal portion 102.

The movable member 103 is configured to connect a control device (not shown). The control device (not shown) controls the movable member 103 to move up and down in the direction of the bottom of the sidewall portion 101 pointing to the top, so as to discharge the photoresist in the accommodation space 104 through the hole 112. It should be noted that the control device (not shown) may be integrated in the movable member 103.

Referring to FIG. 3, the storage container 100 further includes a push rod 201. The push rod 201 is configured to connect the control device 200. The control device 200 moves the push rod 201 to push the movable member 103 to move up and down in the direction of the bottom of the sidewall portion 101 pointing to the top.

Specifically, part of a rod portion of the push rod 201 is located in the control device 200. The control device 200 controls an extension length of the push rod 201, and then pushes the movable member 103 to move up and down in the direction of the bottom of the sidewall portion 101 pointing to the top. In addition, a top area of the push rod 201 is greater than the rod portion, for increasing a contact area between the push rod 201 and the movable member 103, so as to prevent push-through of the movable member 103 by the push rod 201 due to excessive pressure.

The movable member 103 includes a sealing portion and a support rod. The sealing portion or the support rod is configured to connect the control device 200. The control device 200 controls the sealing portion to move up and down in the direction of the bottom of the sidewall portion 101 pointing to the top. Two specific implementation manners of the sealing portion or the support rod are provided in this embodiment. The implementation manners of the sealing portion or the support rod are described in detail below with reference to the accompanying drawings.

Manner I: Referring to FIG. 4, the sealing portion 301 is fixed to a top end of the support rod 302, and the support rod 302 is connected to the control device 200. The control device 200 is configured to control the support rod 302 to drive the sealing portion 301 to move up and down in the direction of the bottom of the sidewall portion 101 pointing to the top.

Specifically, part of a rod portion of the push rod 302 is located in the control device 200. The control device 200 controls an extension length of the push rod 302, and then pushes the movable member 103 to move up and down in the direction of the bottom of the sidewall portion 101 pointing to the top.

It should be noted that the support rod 302 and the control device 200 may be connected through a spiral thread or bayonet. Specifically, the support rod 302 is provided with a spiral thread or bayonet, and the control device 200 is provided with a spiral thread or bayonet matching that on the support rod 302; the control device 200 controls the support rod 302 to rotate through the spiral thread to enable the support rod 302 to move up and down in the direction of the bottom of the sidewall portion 101 pointing to the top; or the control device 200 controls, through the bayonet, the support rod 302 to move up and down in the direction of the bottom of the sidewall portion 101 pointing to the top.

Specifically, referring to FIG. 7, the support rod 602 has a diameter of 3 cm and a length of 26 cm. The length of the support rod 602 is slightly greater than a height of the bottle body portion 121, so that the photoresist accommodated in the bottle body portion 121 can be completely pressed out. A diameter of the bottleneck portion 111 is smaller than that of the bottle body portion 121, so as to prevent slippage of the movable member. The sealing portion includes a piston 601 and a sealing ring 603. A diameter of the sealing portion is 15 cm, which is the same as the inner surface diameter of the bottle body portion 121. The piston 601 has a diameter ranging from 11 cm to 14 cm. The sealing ring has a thickness ranging from 0.5 cm to 2 cm. Specifically, a sum of the diameter of the piston and twice the thickness of the sealing ring is the same as the diameter of the sealing portion. With the sealing ring 603, leakage of the photoresist in the accommodation space 104 through the sealing portion is prevented. The piston 601 is fixed to a top of the support rod 602, and the sealing ring 603 is fixed to an edge of the piston 601. The control device 200 controls the piston 601 to move up and down in a direction of the bottom of the sidewall portion 101 pointing to the top, so as to discharge the photoresist in the accommodation space 104 through the hole 112.

Manner II: Referring to FIG. 5, the storage container 100 further includes a fixing portion 403. The fixing portion 403 is located at a bottom edge of the sidewall portion 101. The fixing portion 403 is configured to fix the support rod 402 into the storage container 100 in parallel to the direction of the bottom of the sidewall portion 101 pointing to the top.

The sealing portion 401 is movably arranged on the support rod 402. The sealing portion 401 is configured to connect the control device 200. The control device 200 is configured to control the sealing portion 401 to enable the sealing portion 401 to move up and down in the direction of the bottom of the sidewall portion 101 pointing to the top.

It should be noted that the sealing portion 401 and the support rod 402 may be connected through a spiral thread or bayonet. Specifically, the support rod 402 is provided with a spiral thread or bayonet, and the sealing portion 401 is provided with a spiral thread or bayonet matching that on the support rod 402; the control device 200 controls, through the spiral thread on the sealing portion 401, the sealing portion 401 to rotate on the support rod 402 to enable the sealing portion 401 to move on the support rod 402; or the control device 200 controls, through the bayonet on the sealing portion 401, the sealing portion 401 to move on the support rod 402.

In this manner, a surface of the sealing portion 401 is provided with a film layer 406 covering the support rod 402 in the accommodation space 104. The photoresist and the support rod 402 in the accommodation space 104 are isolated through the film layer 406.

In this manner, the storage container 100 further includes a lock joint 404. The lock joint 404 is movably arranged on the support rod 402, and the lock joint 404 is located below the sealing portion 401. Slippage of the sealing portion 401 is prevented through the support by the lock joint 404 located below the sealing portion 401.

A cap 405 is fixed to a top of the support rod 402, and a size of the cap 405 is greater than that of the support rod 402. With the cap 405 at the top of the support rod 402, detachment of the sealing portion 401 from the support rod 402 from the top is prevented.

It should be noted that referring to FIG. 6, the sealing portion includes a piston 501 and a sealing ring 502. The sealing ring 502 is located at an edge of the piston 501. With the sealing ring 502, leakage of the photoresist in the accommodation space 104 through the sealing portion is prevented. In the case of Manner II, the piston has a piston hole 503 in the middle, and the piston hole 503 is of a same size as the support rod 402.

Compared with the related art, the embodiments of the present disclosure provide a new storage container 100 for accommodating and removing a photoresist, in which the movable member 103 moves up and down in parallel to the direction of the bottom of the sidewall portion 101 pointing to the top, so that the accommodation space 104 defined by the sidewall portion 101, the seal portion 102 and the movable member 103 becomes smaller, so as to enable the photoresist to be pressed out from the hole 112 in the seal portion 102 to avoid the contact between the photoresist and the air, thereby avoiding the dissolution of gas in the photoresist and solving the problem in the related art that bubbles dissolving in the photoresist may lead to an anomaly in the photoresist in a coating process.

Figure 8:
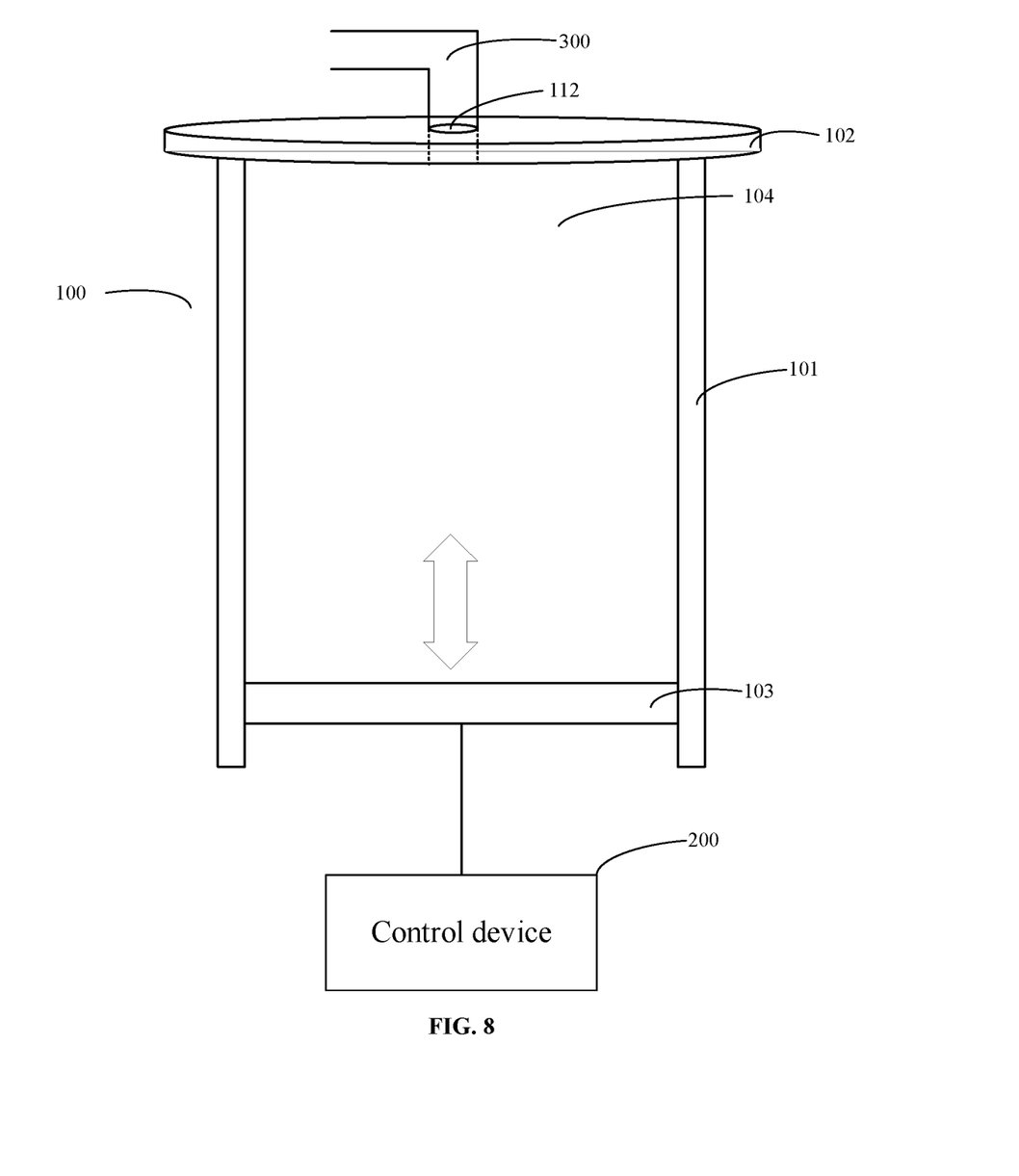
FIG. 8 is a schematic structural diagram of a supply system according to some embodiments of the present disclosure.

Another embodiment of the present disclosure relates to a supply system. Referring to FIG. 8, the supply system includes: a control device 200, a liquid outlet conduit 300 and the storage container 100. The liquid inlet end of the liquid outlet conduit 300 is connected to the hole 112 on the seal portion 102 in the storage container 100. The control device 200 is connected to the movable member 103 in the storage container 100 and configured to control the movable member 103 to move up and down in the direction of the bottom of the sidewall portion 101 in the storage container 100 pointing to the top, so as to enable the photoresist accommodated in the storage container 100 to enter the liquid outlet conduit 300 through the hole 112. The liquid inlet end of the liquid outlet conduit 300 is configured to apply the photoresist removed from the storage container 100.

FIG. 8 is a schematic structural diagram of a supply system according to an embodiment. The supply system according to this embodiment is specifically described below with reference to the drawing.

Specifically, the storage container 100 includes: a sidewall portion 101, a seal portion 102 and a movable member 103. The sidewall portion 101, the seal portion 102 and the movable member 103 define an accommodation space 104. The accommodation space 104 is configured to accommodate the photoresist. The seal portion 102 is adapted to seal a top of the sidewall portion 101, and the seal portion 102 is provided with a hole 112. The hole 112 is configured to connect a liquid inlet end of a liquid outlet conduit 300.

As the movable member 103 moves up and down, a volume of the accommodation space 104 also becomes larger or smaller. When the accommodation space 104 becomes smaller, the photoresist accommodated in the accommodation space 104 is discharged through the hole 112 in the seal portion 102.

A discharge rate of the photoresist is controlled by controlling, through the control device 200, a rate at which the movable member 103 moves up. Specifically, a volume of the photoresist discharged per unit time can be obtained by controlling, through the control device 200, a rate at which the movable member 103 moves up and down in combination with a cross-sectional area of the sidewall portion 101.

Compared with the related art, the supply system according to this embodiment controls, through the control device 200, the movable member 103 in the storage container 100 to move up and down in the direction of the bottom of the sidewall portion 101 pointing to the top, so as to discharge the photoresist in the accommodation space 104 through the hole 112, and applies the discharged photoresist through the liquid outlet conduit 300 to prevent generation of bubbles caused by the dissolution of gas in the photoresist, thereby avoiding the problem of an anomaly in the photoresist in a coating process caused by the bubbles dissolving in the photoresist in the related art.

It should be noted that all the units involved in this embodiment are logical units. In practical application, a logical unit may be a physical unit or a part of the physical unit, or may be implemented through a combination of a plurality of physical units. In addition, in order to highlight the innovative portion of the present disclosure, units that are not closely related to the technical problem set forth in the present disclosure are not introduced in this embodiment, which, however, does not indicate that other units do not exist in this embodiment.

Since the above embodiment and this embodiment are corresponding to each other, this embodiment and the above embodiment can collaborate with each other for implementation. Related technical details described in the above embodiment are still valid in this embodiment, and technical effects that can be achieved in the above embodiment may also be achieved in this embodiment, and are not described herein to avoid repetition. Correspondingly, related technical details described in this embodiment may also be applied to the above embodiment.

Those of ordinary skill in the art may understand that the above embodiments are specific embodiments for implementing the present disclosure. However, in practical applications, various changes in forms and details may be made thereto without departing from the spirit and scope of the present disclosure.

What is claimed is:

1. A storage container for accommodating and removing a photoresist, comprising:
    a sidewall portion, a seal portion and a movable member, the sidewall portion, the seal portion and the movable member defining an accommodation space;
    the seal portion being adapted to seal a top of the sidewall portion, and the seal portion being provided with a hole communicated with the accommodation space, the hole being configured to connect a liquid inlet end of a liquid outlet conduit;
    the movable member being adapted to seal a bottom of the sidewall portion, and further adapted to move up and down in parallel to a direction of the bottom of the sidewall portion pointing to the top; and
    the movable member being configured to connect a control device, the control device controlling the movable member to move up and down in the direction of the bottom of the sidewall portion pointing to the top, so as to discharge the photoresist in the accommodation space through the hole;
    wherein the movable member comprises a sealing portion and a support rod;
    the sealing portion or the support rod is configured to connect the control device, the sealing portion is movably arranged on the support rod, and the control device is configured to control the sealing portion to move up and down in the direction of the bottom of the sidewall portion pointing to the top; and
    a surface of the sealing portion is provided with a film layer covering the support rod in the accommodation space.

2. The storage container according to claim 1, wherein the control device is integrated in the movable member.

3. The storage container according to claim 1, wherein:
    the storage container further comprises a push rod, the push rod configured to connect the control device; and
    the control device is configured to move the push rod to push the movable member to move up and down in the direction of the bottom of the sidewall portion pointing to the top.

4. The storage container according to claim 1, wherein:
    the storage container further comprises a fixing portion, the fixing portion is located at a bottom edge of the sidewall portion, and the fixing portion is configured to fix the support rod into the storage container in parallel to the direction of the bottom of the sidewall portion pointing to the top.

5. The storage container according to claim 4, wherein:
    the support rod is provided with a spiral thread or bayonet, and the sealing portion is provided with a spiral thread or bayonet matching that on the support rod;
    the control device is configured to control, through the spiral thread on the sealing portion, the sealing portion to rotate on the support rod to enable the sealing portion to move on the support rod;
    or the control device is configured to control, through the bayonet on the sealing portion, the sealing portion to move on the support rod.

6. The storage container according to claim 4, wherein the storage container further comprises a lock joint, the lock joint is movably arranged on the support rod, and the lock joint is located below the sealing portion.

7. The storage container according to claim 4, wherein a cap is fixed to a top of the support rod, and a size of the cap is greater than that of the support rod.

8. The storage container according to claim 1, wherein the sealing portion comprises a piston and a sealing ring, the sealing ring is located at an edge of the piston.

9. The storage container according to claim 1, wherein:
the seal portion is provided with N holes, N is a natural number greater than or equal to 2; and
each of the N holes is connected to a liquid inlet end of a sub-conduit, and the liquid outlet ends of the N sub-conduits are configured to connect the liquid inlet end of the liquid outlet conduit.

10. The storage container according to claim 9, wherein:
the liquid outlet ends of the N sub-conduits are configured to connect liquid inlet ends of M liquid outlet conduits, M is a natural number greater than or equal to 2 and M is less than N; and
each of the M liquid outlet conduits is connected to at least one of the N sub-conduits.

11. The storage container according to claim 9, wherein the storage container further comprises a valve, the valve is mounted in at least one of the sub-conduit and the liquid outlet conduit.

12. A supply system, comprising:
a control device, a liquid outlet conduit, and the storage container according to claim 1;
the liquid inlet end of the liquid outlet conduit being connected to the hole on the seal portion in the storage container;
the control device being connected to the movable member in the storage container and configured to control the movable member to move up and down in the direction of the bottom of the sidewall portion in the storage container pointing to the top, so as to enable the photoresist accommodated in the storage container to enter the liquid outlet conduit through the hole; and
the liquid outlet end of the liquid outlet conduit being configured to apply the photoresist removed from the storage container.

13. The storage container according to claim 1, wherein the sidewall portion comprises a bottleneck portion and a bottle body portion, and a diameter of the bottleneck portion is smaller than a diameter of the bottle body portion.

14. The supply system according to claim 12, wherein the control device is integrated in the movable member.

15. The supply system according to claim 12, wherein:
the storage container further comprises a push rod, the push rod is configured to connect the control device; and
the control device is configured to move the push rod to push the movable member to move up and down in the direction of the bottom of the sidewall portion pointing to the top.

16. The supply system according to claim 12, wherein:
the storage container further comprises a fixing portion, the fixing portion is located at a bottom edge of the sidewall portion, and the fixing portion is configured to fix the support rod into the storage container in parallel to the direction of the bottom of the sidewall portion pointing to the top.

* * * * *